United States Patent
Lee

(10) Patent No.: US 10,552,328 B2
(45) Date of Patent: Feb. 4, 2020

(54) STORAGE DEVICE AND OPERATING METHOD THEREOF

(71) Applicant: SK hynix Inc., Gyeonggi-do (KR)

(72) Inventor: Sok Kyu Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/987,384

(22) Filed: May 23, 2018

(65) Prior Publication Data

US 2019/0121741 A1 Apr. 25, 2019

(30) Foreign Application Priority Data

Oct. 19, 2017 (KR) .................. 10-2017-0135890

(51) Int. Cl.
*G11C 16/26* (2006.01)
*G06F 12/0868* (2016.01)
*G11C 16/04* (2006.01)

(52) U.S. Cl.
CPC .......... *G06F 12/0868* (2013.01); *G11C 16/26* (2013.01); *G06F 2212/1016* (2013.01); *G11C 16/0483* (2013.01)

(58) Field of Classification Search
CPC .................................................. G06F 12/0893
USPC .................................................. 711/E12.041
See application file for complete search history.

(56) References Cited

U.S. PATENT DOCUMENTS

| | | | |
|---|---|---|---|
| 2003/0145114 A1* | 7/2003 | Gertner | H04L 67/1097 709/246 |
| 2011/0004730 A1* | 1/2011 | Kimura | G06F 12/0893 711/133 |
| 2015/0309742 A1* | 10/2015 | Amidi | G06F 3/0619 714/758 |
| 2016/0283389 A1* | 9/2016 | Diamand | G06F 12/0811 |
| 2017/0153826 A1* | 6/2017 | Cho | G06F 3/0679 |

FOREIGN PATENT DOCUMENTS

KR 1020050096445 10/2005
KR 1020120070012 6/2012

* cited by examiner

*Primary Examiner* — Min Huang
(74) *Attorney, Agent, or Firm* — IP & T Group LLP

(57) ABSTRACT

There are provided a memory controller for controlling a memory device to perform a more stable sensing operation, a storage device including the memory controller, and an operating method of the storage device. A memory controller includes: a processor for transmitting a cache read command to a memory device and then transmitting a status read command to the memory device; and a cache read controller for outputting a data-out command to the memory device according to a sensing section code included in a status read response transmitted by the memory device in response to the status read command.

16 Claims, 13 Drawing Sheets

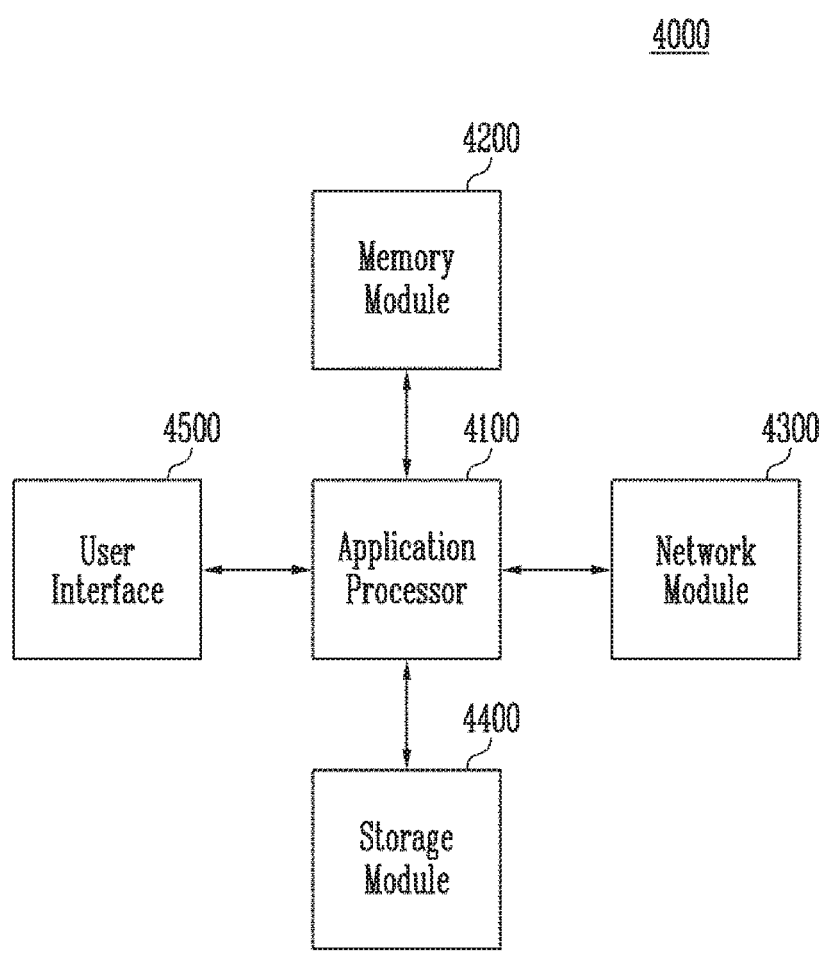

STORAGE DEVICE AND OPERATING METHOD THEREOF

CROSS-REFERENCE TO RELATED APPLICATION

The present application claims priority to Korean patent application number 10-2017-0135890 filed on Oct. 19, 2017, disclosure of which is incorporated herein by reference in its entirety.

BACKGROUND

1. Field of Invention

Various exemplary embodiments of the present disclosure generally relate to an electronic device. Particularly, the embodiments relate to a storage device and an operating method thereof.

2. Description of the Related Art

A storage device is a device that stores data under the control of a host device such as a computer, a smart phone, or a smart pad. A storage device may include a memory device for storing data and a memory controller for controlling the memory device. The memory device is generally classified into a volatile memory device and a nonvolatile memory device.

The volatile memory is a memory device which loses stored data when a power supply is cut off. Examples of the volatile memory are a static random access memory (SRAM), a dynamic RAM (DRAM), a synchronous DRAM (SDRAM), and the like.

The nonvolatile memory is a memory device which retains stored data even when a power supply is cut off. Examples of the nonvolatile memory are a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

Embodiments provide a memory controller for controlling a memory device to perform a more stable sensing operation, a storage device including the memory controller, and an operating method of the storage device.

According to an aspect of the present disclosure, there is provided a memory controller including: a processor configured to transmit a cache read command to a memory device and then transmit a status read command to the memory device; and a cache read controller configured to output a data-out command to the memory device according to a sensing section code included in a status read response transmitted by the memory device in response to the status read command.

According to an aspect of the present disclosure, there is provided a method for operating a memory controller for controlling a memory device, the method including: transmitting, to the memory device, a cache read command for at least two pages included in the memory device; transmitting, to the memory device, a status read command for requesting data of a status register for storing an operation status of the memory device; and transmitting a data-out command to the memory device according to a sensing section code included in a status read response transmitted by the memory device in response to the status read command.

According to an aspect of the present disclosure, there is provided a storage device including: a memory device configured to perform an operation corresponding to a cache read command for at least two pages; and a memory controller configured to transmit a data-out command to the memory device, based on a sensing section code included in a status read response transmitted by the memory device in response to a status read command transmitted to the memory device.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 17 is a block diagram illustrating a user system to which the storage device is applied according to an embodiment of the present disclosure.

DETAILED DESCRIPTION

Figure 1:
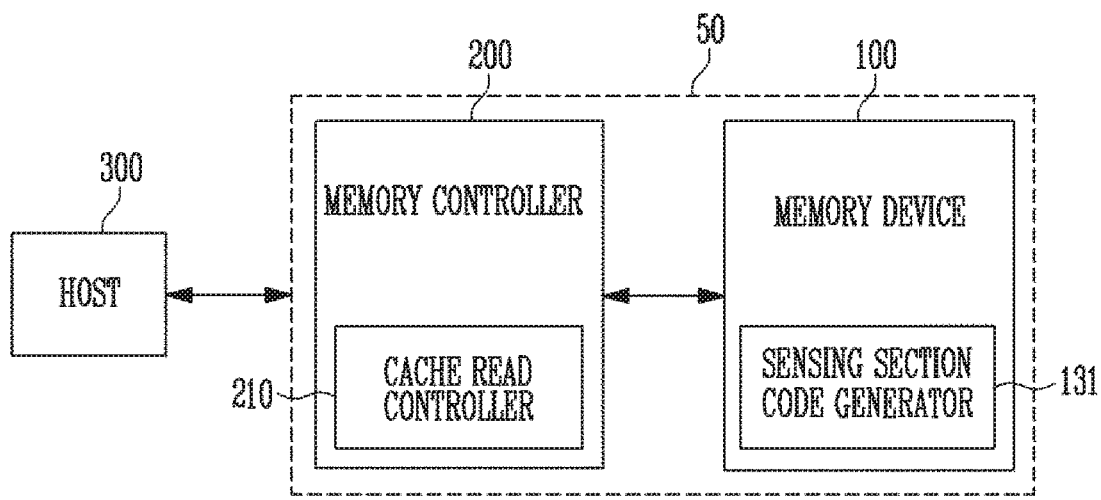
FIG. 1 is a diagram illustrating a storage device according to an embodiment of the present disclosure.

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

The embodiments according to the concept of the present disclosure can be variously modified and have various shapes. Thus, the embodiments are illustrated in the drawings and are intended to be described herein in detail. However, the embodiments according to the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "between," "immediately between" or "adjacent to" and "directly adjacent to" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary embodiments of the present disclosure will be described in detail with reference to the accompanying drawings in order for those skilled in the art to be able to readily implement the technical spirit of the present disclosure.

FIG. 1 is a diagram illustrating a storage device 50 according to an embodiment of the present disclosure.

Referring to FIG. 1, the storage device 50 may include a memory device 100 and a memory controller 200.

The memory device 100 may store data. The memory device 100 operates in response to the control of the memory controller 200. The memory device 100 may include a memory cell array (not shown) including a plurality of memory cells that store data. In an embodiment, the memory device 100 may be a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like.

The memory device 100 may receive a command and address from the memory controller 200 and access a region selected by the address in the memory cell array. That is, the memory device 100 may perform an operation corresponding to the command on the region selected by the address. For example, the memory device 100 may perform a program operation, a read operation, and an erase operation. In the program operation, the memory device 100 may program data in the region selected by the address. In the read operation, the memory device 100 may read data from the region selected by the address. In the erase operation, the memory device 100 may erase data stored in the region selected by the address.

In an embodiment, the program operation and the read operation may be performed in units of pages, and the erase operation may be performed in units of blocks.

The read operation may be an operation of storing page data obtained by reading the data stored in the selected region in a page buffer (not shown) included in the memory device 100. After the read operation is performed, the memory controller 200 may transmit a data-out command to the memory device 100. The memory device 100 may provide the page data stored in the page buffer to the memory controller 200 in response to the data-out command.

In various embodiments, the memory device 100 may support a cache read operation of reading data of a page of the memory cell array through a page buffer included in the memory device 100 while outputting data currently stored in the page buffer, to the memory controller 200 so as to improve performance.

That is, the cache read operation may be an operation including read operations and data output operations on at least one page. Therefore, a data output operation of outputting from a page buffer previously read and currently stored page data and a read operation of storing into the page buffer data of a currently read page may be simultaneously performed.

Meanwhile, when the memory device 100 performs a read operation or a verify operation, the memory device 100 performs a sensing operation of sensing data stored in a memory cell. The sensing operation is performed in a sensing section among a plurality of sections that constitute the read operation. In the sensing section, the memory device 100 determines data stored in a selected memory cell, using a change in voltage or current of a bit line coupled to the corresponding memory cell. Therefore, it is difficult to ensure accurate sensing when operations requiring a large amount of power are simultaneously performed or power noise occurs during the sensing section.

According to the embodiment of the present disclosure, the memory device 100 may include a sensing section code generator 131.

The sensing section code generator 131 may generate a sensing section code indicating whether the memory device 100 is performing the sensing operation. When the memory device 100 is in the sensing section while performing the read operation or the verify operation, the sensing section code generator 131 generates a sensing section code indicating that the sensing operation is being performed. Specifically, if the memory device 100 is in the sensing section, the sensing section code generator 131 may generate the sensing section code to be in a set status. If the memory device 100 is not in the sensing section, the sensing section code generator 131 may generate the sensing section code to be in a disabled status (i.e. release status). The memory device 100 may provide the sensing section code to the memory controller 200. A method for generating a sensing section code and providing the generated sensing section code to the memory controller 200 will be described in more detail with reference to FIGS. 3 to 13.

The memory controller 200 may control overall operations of the memory device 100. The memory controller 200 may control an operation of the memory device 100 in response to a request of a host 300 or regardless of the request of the host 300.

For example, the memory controller 200 may control the memory device 100 to perform a program operation, a read operation, an erase operation, or the like in response to a request of the host 300. In the program operation, the memory controller 200 may provide a program command, an address, and data to the memory device 100. In the read operation, the memory controller 200 may provide a read command and an address to the memory device 100. In the erase operation, the memory controller 200 may provide an erase command and an address to the memory device 100.

In an embodiment, the memory controller 200 may autonomously generate a program command, an address, and data and transmit them to the memory device 100, without the request from the host 300. For example, the memory controller 200 may provide a command, an address, and data to the memory device 100 so as to perform background operations such as a program operation for wear leveling and a program operation for garbage collection.

The memory controller 200 may execute firmware (FW) for controlling the memory device 100. When the memory device 100 is a flash memory device, the memory controller 200 may operate firmware such as a flash translation layer (FTL) for controlling communication between the host 300 and the memory device 100. Specifically, the memory controller 200 may translate a logical address included in the request from the host 300 into a physical address that is the address ADD to be provided to the memory device 100.

The memory controller 200 according to the embodiment of the present disclosure may include a cache read controller 210.

The cache read controller 210 may control a cache read operation on the memory device 100. In the cache read operation, the cache read controller 210 may provide a cache read command and an address to the memory device 100. In an embodiment, the address provided to the memory device 100 in the cache read operation may be an address corresponding to a plurality of pages. Alternatively, the address provided to the memory device 100 in the cache read operation may be a sequential address that sequentially increases or decreases. In response to the cache read command, the memory device 100 may read, in units of pages, data corresponding to the plurality of pages according to cache read.

If a preset time elapses after the cache read command is provided to the semiconductor memory device 100, the cache read controller 210 may provide a status read command to the memory device 100. The status read command may be a command for requesting a value of a status register included in the memory device 100. In response to the status read command, the memory device 100 may provide the value stored in the status register as a status read response to the memory controller 200.

The cache read controller 210 may receive the status read response transmitted from the memory device 100 in response to the status read command.

The cache read controller 210 may determine whether a sensing section code included in the status read response is in the disabled status. If the sensing section code is in the set status, the cache read controller 210 may again provide the status read command to the memory device 100. Alternatively, if the sensing section code is in the disabled status, the cache read controller 210 may provide a data-out command to the memory device 100. Accordingly, the storage device 50 can perform more accurate data sensing.

The host 300 may communicate with the storage device 50, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), and the like.

Figure 2:
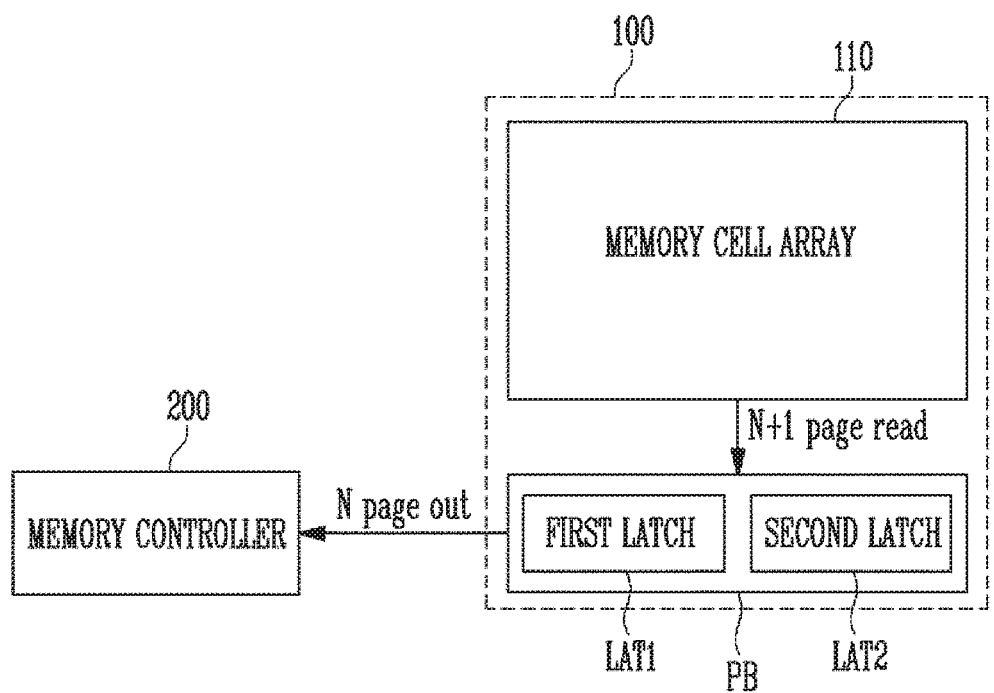
FIG. 2 is a diagram illustrating a cache read operation.

FIG. 2 is a diagram illustrating the cache read operation.

Referring to FIG. 2, the memory device 100 includes a memory cell array 110 and a page buffer PB. Although FIG. 2 shows only the memory cell array 110 and the page buffer PB included in the memory device 100, the present disclosure is not limited thereto. That is, FIG. 2 is a diagram for convenience of description, and many components other than the memory cell array 110 and the page buffer PB may be included in the memory device 100.

The cache read operation may be an operation of reading data of a page of the memory cell array into the page buffer included in the memory device 100 while outputting data of another page, which is previously read and stored in the page buffer, to the memory controller 200.

FIG. 2 illustrates a storage device for performing the cache read operation on at least one page. FIG. 2 illustrates a method for performing cache read on two consecutive pages N page and N+1 page according to an address at which the cache read is requested.

The page buffer PB may include a first latch LAT1 and a second latch LAT2. The first latch LAT1 may be a main latch and the second latch LAT2 may be a cache latch. Data read from the memory cell array 110 may be stored in the first latch LAT1 as a main latch. The data stored in the main latch may be transferred to the second latch LAT2.

First, a read operation on an Nth page may be performed. If the read operation is performed, Nth page data may be stored in the first latch LAT1. In an embodiment, the data stored in the first latch LAT1 may be transferred to the second latch LAT2.

If data is stored in the second latch LAT2, the stored data may be output in response to a request of the memory controller 200. The Nth page data stored in the second latch LAT2 may be provided to the memory controller 200, which is referred to as "N page out" in FIG. 2.

While the Nth page data stored in the second latch LAT2 is being provided to the memory controller 200, (N+1)th page data of the memory cell array 110 may be read, and the read (N+1)th page data may be stored in the first latch LAT1, which is referred to as "N+1 page read" in FIG. 2.

Although one page buffer PB is illustrated in FIG. 2, this is for convenience of description. In various embodiments, the page buffer PB may be provided for each bit line coupled to a memory cell.

Figure 3:
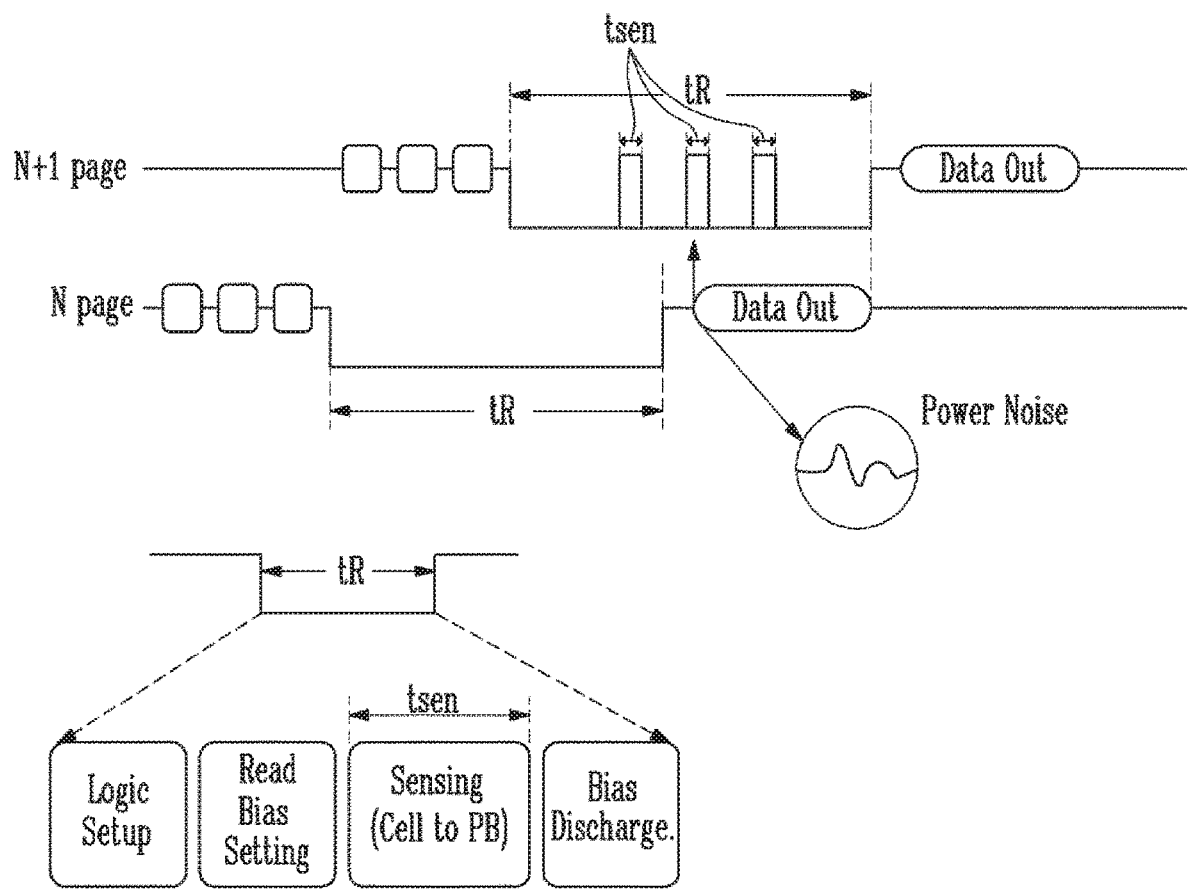
FIG. 3 is a diagram illustrating a problem that may occur in the cache read operation.

FIG. 3 is a diagram illustrating a problem that may occur in the cache read operation.

Referring to FIG. 3, a cache read operation of data of an Nth page N page and an (N+1)th page N+1 page is illustrated. If the time required to perform a read operation on one page is time tR, the time tR is required to perform the read operation on each of the Nth page N page and the (N+1)th page N+1 page. As time tR elapses, each data read from the Nth page N page and the (N+1)th page N+1 page may be stored in the page buffer PB described with reference to FIG. 2. Subsequently, the data stored in the page buffer PB may be output in response to the data-out command input from the memory controller.

Meanwhile, the time tR is required to perform the read operation, and may be divided into a plurality of sections. For example, the read operation may be divided into a logic setup section, a read bias setting section, a sensing section, and a bias discharge section.

The logic setup section is a section for receiving a read command and setting up a relative logic. For example, the logic setup section may be a section for loading an algorithm for performing a read operation.

The read bias setting section may be a section for generating a voltage related to the read operation, using a voltage pump, and applying the generated voltage. For example, a read voltage Vread may be applied to a selected word line, and a pass voltage Vpass may be applied to unselected word lines.

The sensing section may be a section for applying voltages set during the read bias setting section and sensing data from a memory cell. For example, as a voltage or current of the bit line coupled to the memory cells is sensed, the data read from the memory cell may be stored in the page buffer.

The bias discharge section may be a section for discharging a voltage of each line coupled to the memory cell array.

The sensing section is a section in which data of a memory cell is stored in the page buffer. Therefore, the accuracy of the read operation may depend on the accuracy of an operation in the sensing section. Meanwhile, the operation of outputting page data stored in the page buffer PB in response to the data-out command requires a large amount of driving power. Hence, when the sensing section overlaps with operation time of the data output operation, power noise occurs and therefore an accurate sensing operation cannot be ensured.

According to the embodiment of the present disclosure, the memory device 100 may generate a sensing section code corresponding to the sensing section and may provide the generated sensing section code to the memory controller 200. If the sensing section code corresponding to the sensing section is input, the memory controller 200 may not provide the data-out command to the memory device 100. That is, the memory controller 200 may provide the data-out command to the memory device 100 such that the sensing section does not overlap with the operation time of the data output operation.

Figure 4:
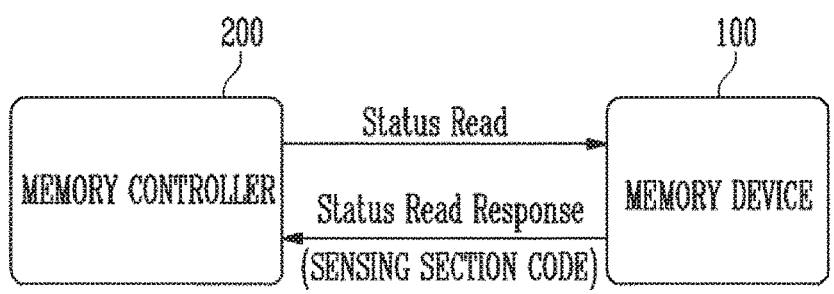
FIG. 4 is a diagram illustrating data communication between a memory controller and a memory device according to an embodiment of the present disclosure.

FIG. 4 is a diagram illustrating data communication between the memory controller 200 and the memory device 100 according to an embodiment of the present disclosure.

Referring to FIG. 4, if a preset time elapses after a cache read command is provided to the memory device 100, the memory controller 200 may provide a status read command to the memory device 100.

The status read command may be a command for requesting a register value corresponding to an operation status of the memory device 100. Specifically, the memory device 100 may update a status register (not shown) included in the memory device 100 according to the operation status of the memory device 100. If the memory device 100 receives the status read command, the memory device 100 may provide a value stored in the status register as a status read response to the memory controller 200 in response to the status read command.

According to the embodiment of the present disclosure, the memory device 100 may generate a sensing section code indicating that the memory device 100 is performing a sensing operation. The sensing section code may be a value stored in the status register. For example, if the memory device 100 is currently in the sensing section, the memory device 100 may store the sensing section code in the status register to be in the set status. If the memory device 100 is currently not in the sensing section, the memory device 100 may store the sensing section code in the status register to be in the disabled status. The memory device 100 may provide a value of the status register including the sensing section code as a status read response to the memory controller 200 in response to the status read command.

Figure 5:
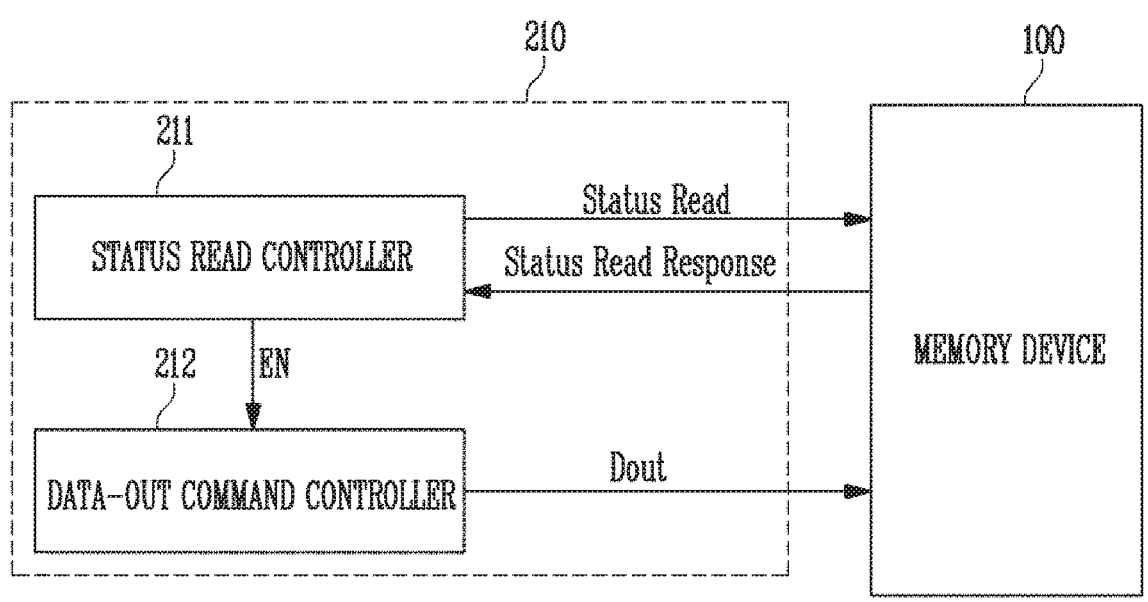
FIG. 5 is a diagram illustrating a structure of a cache read controller of FIG. 1.

FIG. 5 is a diagram illustrating a structure of the cache read controller 210 of FIG. 1.

Referring to FIG. 5, the cache read controller 210 may include a status read controller 211 and a data-out command controller 212. Although FIG. 5 shows the cache read controller 210 including the status read controller 211 and the data-out command controller, the present disclosure is not limited thereto. That is, illustrations in FIG. 5 are for convenience of description, and the cache read controller 210 or components of the memory controller are not limited by the embodiment of FIG. 5.

In FIG. 5, it is assumed that the memory controller 200 is in a state in which it provides a cache read command to the memory device 100.

The status read controller 211 may transmit a status read command just after the cache read command is provided to the memory device 100 or after a preset time elapses from a time point when the cache read command is provided to the memory device 100. The status read command may be a command for requesting a register value corresponding to an operation status of the memory device 100. Specifically, the memory device 100 may update a status register (not shown) included in the memory device 100 according to the operation status of the memory device 100. If the memory device 100 receives the status read command, the memory device 100 may provide a value stored in the status register as a status read response to the memory controller in response to the status read command.

The status read controller 211 may receive the status read response from the memory device 100. In an embodiment, the status read response provided from the memory device 100 may include a sensing section code indicating whether the memory device 100 is sensing data stored in a memory cell. For example, when the memory device 100 is currently sensing the data, the sensing section code indicating the set status may be included in the status read response. Alternatively, when the memory device 100 is not currently sensing the data, the sensing section code indicating the disabled status may be included in the status read response.

If the sensing section code included in the status read response is in the set status, the status read controller 211 may not output an enable signal EN to the data-out command controller 212. Alternatively, if the sensing section code included in the status read response is in the disabled status, the status read controller 211 may output the enable signal EN to the data-out command controller 212.

The data-out command controller 212 may provide a data-out command Dout to the memory device 100 in response to the enable signal EN.

Consequently, the memory controller may provide the data-out command Dout only when the memory device 100 is not currently sensing the data, so that the data output operation and the sensing operation can be controlled not to be simultaneously performed.

Figure 6:
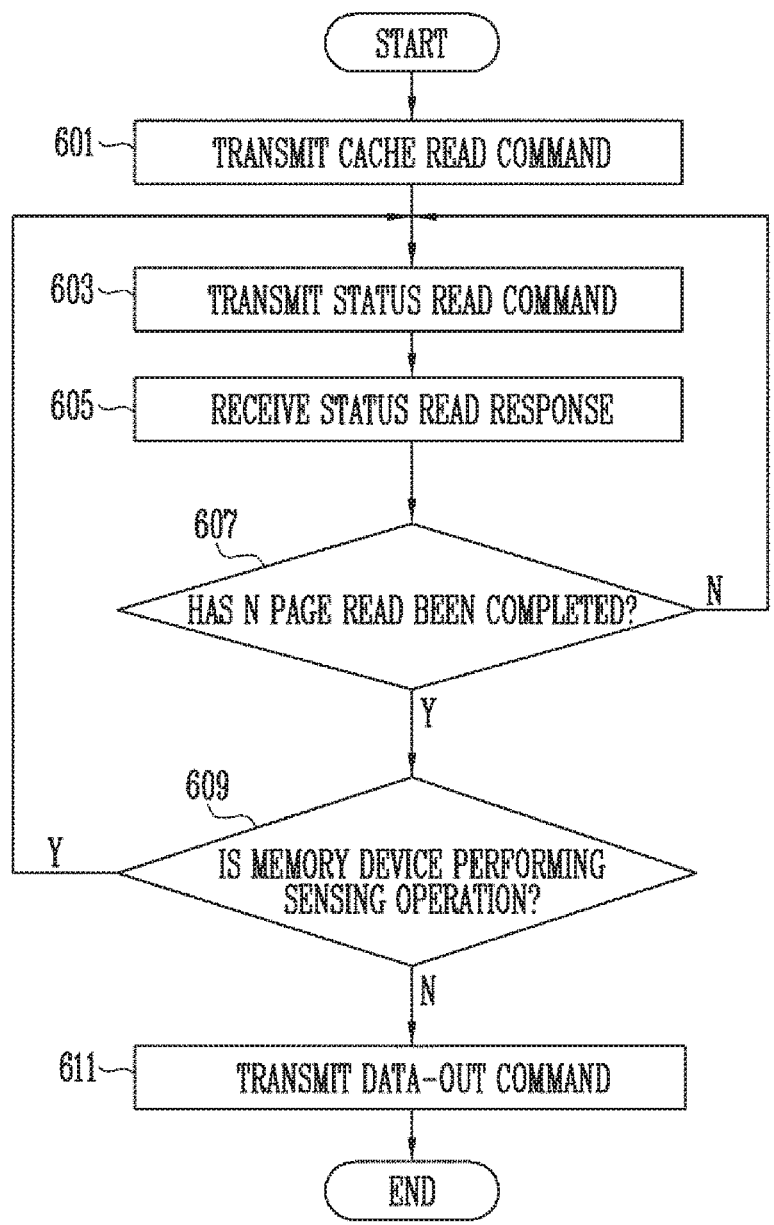
FIG. 6 is a flowchart illustrating an operation of the memory controller according to an embodiment of the present disclosure.

FIG. 6 is a flowchart illustrating an operation of the memory controller 200 according to an embodiment of the present disclosure.

Referring to FIG. 6, in step 601, the memory controller 200 may transmit a cache read command to the memory device 100. The cache read command may be a command for instructing the memory device 100 to read data from at least two pages among the memory cells included in the memory device 100. In an embodiment, the cache read command may be a command for instructing the memory device 100 to perform a read operation on an Nth page and an (N+1)th page.

In step 603, the memory controller 200 may transmit a status read command to the memory device 100.

In step 605, the memory controller 200 may receive a status read response transmitted from the memory device 100 in response to the status read command transmitted in the step 603. The status read response corresponding to the Nth page may include data indicating whether a read operation of the Nth page is currently being performed.

In step 607, the memory controller 100 may determine based on the received status read response whether a read operation of the Nth page has been completed. When the read operation of the Nth page is completed, the data read from the Nth page may be stored in the page buffer.

As the determined result of the step 607, when the read operation of the Nth page is not completed (that is, 'N' at step 607), the memory controller 200 may return to the step 603 to re-transmit the status read command.

As the determined result of the step 607, when the read operation of the Nth page is completed (that is, 'Y' at step 607), the memory controller 200 proceeds to step 609.

In the step 609, the memory controller 200 may determine whether the memory device 100 is performing a sensing operation based on the sensing section code included in the status read response. If the sensing section code is in the set status, the memory device 100 may be performing the sensing operation. Alternatively, if the sensing section code is in the disabled status, the memory device 100 may not be performing the sensing operation. If the memory device 100 performs the sensing operation (that is, 'Y' at step 609), the memory controller 200 may return to the step 603 to re-transmit the status read command.

As the determined result of the step 609, if the memory device 100 does not perform the sensing operation (that is, 'N' at step 609), the memory controller proceeds to step 611.

In the step 611, the memory controller 200 may transmit a data-out command to the memory device 100. Consequently, the memory controller 200 provides the data-out command only when the memory device 100 is not performing the sensing operation, so that the data output operation and the sensing operation can be controlled not to be simultaneously performed.

Figure 7:
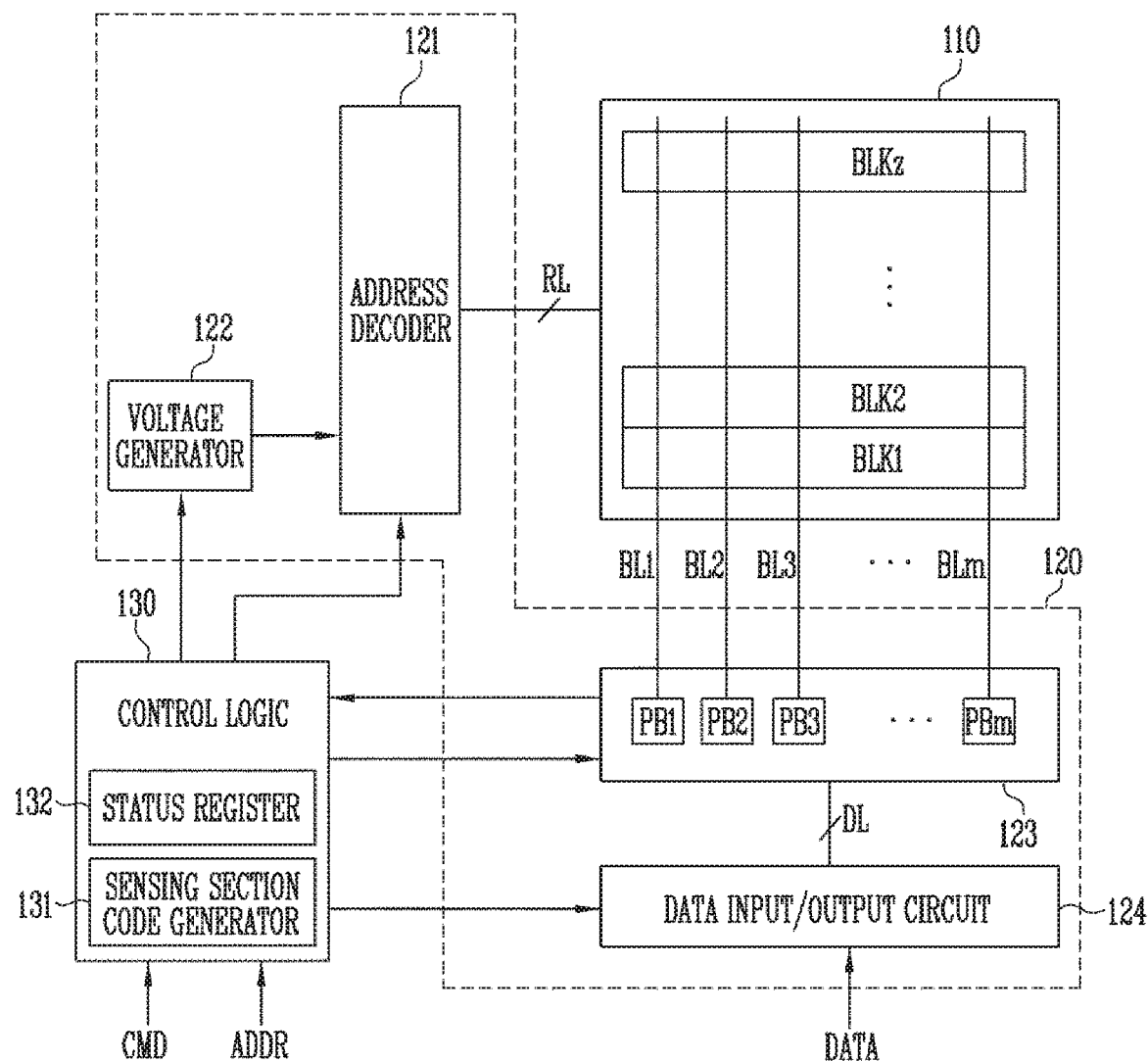
FIG. 7 is a diagram illustrating a structure of the memory device of FIG. 1.

FIG. 7 is a diagram illustrating a structure of the memory device 100 of FIG. 1.

Referring to FIG. 7, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells. Among the plurality of memory cells, memory cells coupled to the same word line are defined as one page. That is, the memory cell array 110 is configured with a plurality of pages. In an embodiment, each of the plurality of memory blocks BLK1 to BLKz included in the memory cell array 110 may include a plurality of dummy cells. One or more dummy cells may be coupled in series between a drain select transistor and memory cells and between a source select transistor and memory cells.

Each of the memory cells of the memory device 100 may be configured as a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, and a data input/output circuit 124.

The peripheral circuit 120 drives the memory cell array 110. For example, the peripheral circuit 120 may drive the memory cell array 120 to perform program, read, and erase operations.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate in response to the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a pass voltage higher than the read voltage to the unselected word lines.

In an embodiment, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In an embodiment, the address decoder 121 may decode a column address in the address ADDR transmitted thereto. The decoded column address may be transmitted to the read/write circuit 123. As an example, the address decoder 121 may include components such as a row decoder, a column decoder, and an address buffer.

The voltage generator 122 generate a plurality of voltages by using an external power voltage supplied to the memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operating voltage of the semiconductor memory device 100.

In an embodiment, the voltage generator 122 may generate a plurality of voltages by using the external power voltage or the internal power voltage. The voltage generator 122 may be configured to generate various voltages required by the semiconductor memory device 100. For example, the voltage generator 122 may generate a plurality of erase voltages, a plurality of program voltages, a plurality of pass voltages, a plurality of select read voltages, and a plurality of unselect read voltages.

In order to generate a plurality of voltages having various voltage levels, the voltage generator 122 may include a plurality of pumping capacitors for receiving the internal power voltage, and generate a plurality of voltages by selectively activating the plurality of pumping capacitors in response to the control of the control logic 130.

The plurality of generated voltages may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate in response to the control of the control logic 130.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transmit, to selected memory cells, the data DATA to be stored, which is received through the data input/output circuit 124, when a program pulse is applied to a selected word line. The memory cells of the selected page may be programmed according to the transmitted data DATA. A memory cell coupled to a bit line to which a program permission voltage (e.g., a ground voltage) is applied may have an increased threshold voltage. The threshold voltage of a memory cell coupled to a bit line to which a program prohibition voltage (e.g., a power voltage) is applied may be maintained. In a program verify operation, the first to mth page buffers PB1 to PBm read page data from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may allow the bit lines BL to be floated. In an embodiment, the read/write circuit 123 may include a column select circuit.

In an embodiment, each of the first to mth page buffers PB1 to PBm may include at least one latch. For example, each of the first to mth page buffers PB1 to PBm may include a main latch and a cache latch.

In a cache read operation, the read/write circuit 123 may read data of a selected page and store the read data in the main latch of each of the first to mth page buffers PB1 to PBm. The stored data may be transferred to the cache latch. Subsequently, while the data of the selected page, which is stored in the cache latch, is being output to the outside, the read/write circuit 123 may read data of the next page of the selected page and store the read data in the main latch of each of the first to mth page buffers PB1 to PBm. The stored data may be transferred to the cache latch.

The data input/output circuit 124 is coupled to the first to mth page buffers PB1 to PBm through the data lines DL. The data input/output circuit 124 operates in response to the control of the control logic 130.

The data input/output circuit 124 may include a plurality of input/output buffers (not shown) that receive input data. In a program operation, the data input/output circuit 124 may receive data DATA to be stored from an external controller (not shown). In a read operation, the data input/output circuit 124 outputs, to the external controller, data transmitted from the first to meth page buffers PB1 to PBm included in the read/write circuit 123.

The control logic 130 may be coupled to the address decoder 121, the voltage generator 122, the read/write circuit 123, and the data input/output circuit 124. The control logic 130 may be configured to control overall operations of the memory device 100. The control logic 130 may operate in response to a command CMD transmitted from an external device.

In an embodiment, the control logic 130 may further include a sensing section code generator 131 and a status register 132.

If a sensing operation of the first to mth page buffers PB1 to PBm included in the read/write circuit 123 is being performed, the sensing section code generator 131 may generate a sensing section code of a set status and store the generated sensing section code in the status register 132. Alternatively, while the sensing operation of the first to mth page buffers PB1 to PBm is not being performed, the sensing section code generator 131 may generate a sensing section code of a disabled status and store the generated sensing section code in the status register 132.

A sensing section may be a section in which the data sensed from the memory cell, which is described with reference to FIG. 3, is stored in the page buffer. In addition, it will be understood that the memory device 100 is performing the sensing operation described with reference to FIGS. 5 and 6 in the sensing section.

The status register 132 may store data indicating an operation status of the memory device 100. The status register 132 may include fail information indicating that the performance of a command received by the memory device 100 has failed, ready information indicating that the memory device 100 can perform an operation, and the sensing section code generated by the sensing section code generator 131.

If a status read command is received from the external controller, the control logic 130 may output the data stored in the status register 132 as a status read response, in response to the status read command.

Figure 8:
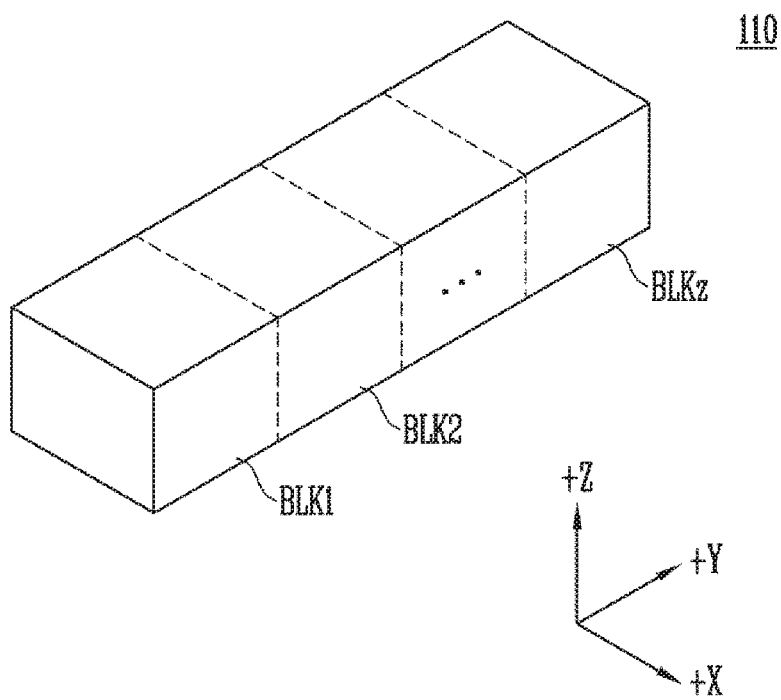
FIG. 8 is a diagram illustrating an embodiment of a memory cell array of FIG. 7.

FIG. 8 is a diagram illustrating an embodiment of the memory cell array 110 of FIG. 7.

Referring to FIG. 8, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. Although FIG. 4 shows memory blocks having the 3-D structure, the present disclosure is not limited thereto, and may also be embodied in a two-dimensional structure. A structure of each memory block will be described in more detail with reference to FIGS. 9 and 10.

Figure 9:
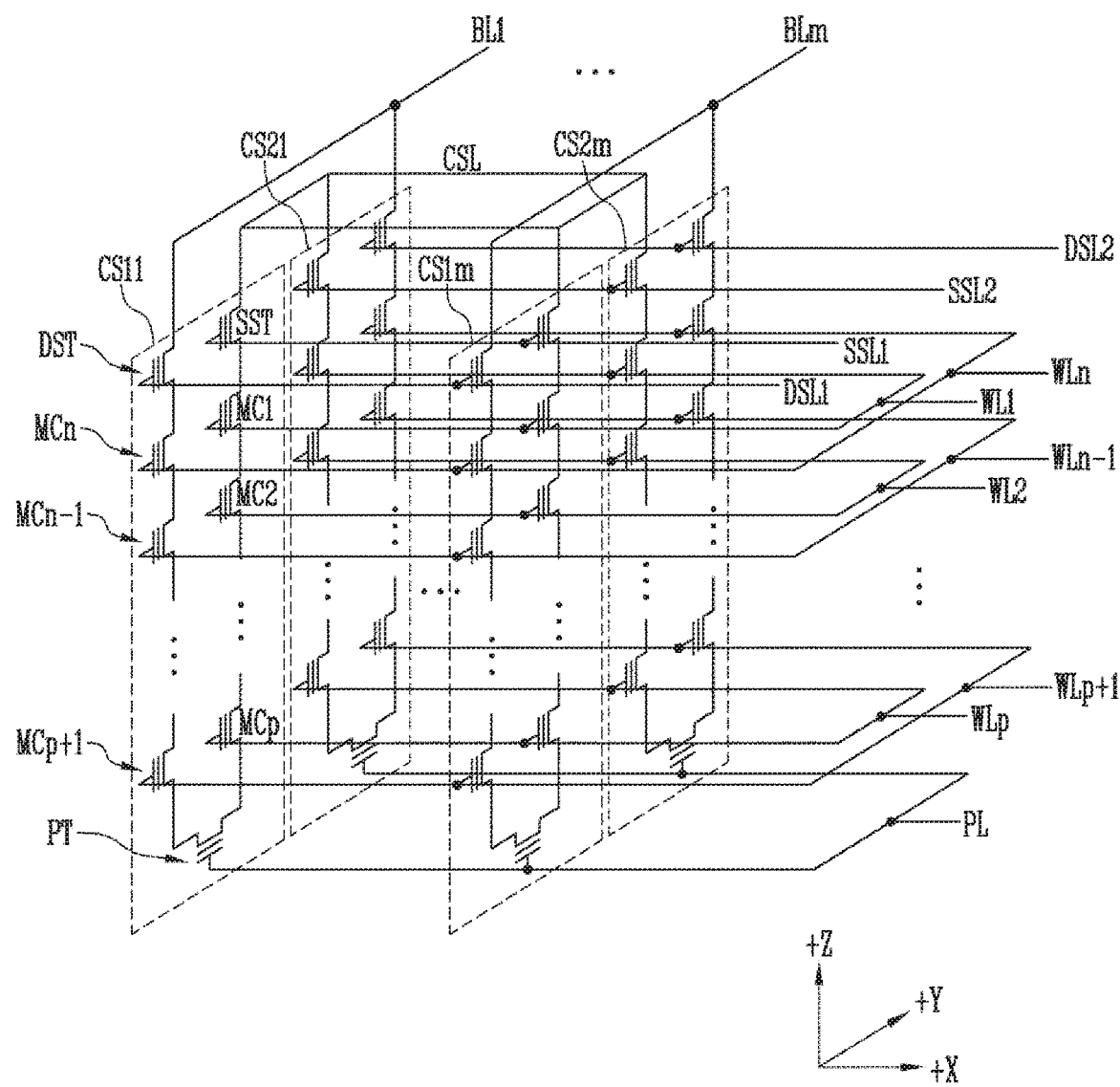
FIG. 9 is a circuit diagram illustrating any one memory block among memory blocks of FIG. 8.

FIG. 9 is a circuit diagram illustrating any one memory block BLKa among the memory blocks BLK1 to BLKz of FIG. 8.

Referring to FIG. 9, the memory block BLKa may include a plurality of cell strings CS11 to CS1*m* and CS21 to CS2*m*. In an embodiment, each of the plurality of cell strings CS11 to CS1*m* and CS21 to CS2*m* may be formed in a 'U' shape. In the memory block BLKa, m cell strings are arranged in a row direction (i.e., a+X direction). Although FIG. 9 illustrates two cell strings arranged in a column direction (i.e., a+Y direction), the present disclosure is not limited thereto. That is, illustrations in FIG. 9 are for convenience of description, and it will be understood that three cell strings may be arranged in the column direction.

Each of the plurality of cell strings CS11 to CS1*m* and CS21 to CS2*m* may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 9, the source select transistors of the cell strings CS11 to CS1*m* on a first row are coupled to a first source select line SSL1. The source select transistors of the cell strings CS21 to CS2*m* on a second row are coupled to a second source select line SSL2.

In another embodiment, the source select transistors of the cell strings CS11 to CS1*m* and CS21 to CS2*m* may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a+Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1*m* on the first row are coupled to a first drain select line DSL1. The drain select transistors of the cell strings CS21 to CS2*m* on the second row are coupled to a second drain select line DSL2.

Cell strings arranged in the column direction are coupled to a bit line extending in the column direction. In FIG. 9, the cell strings CS11 and CS21 on a first column are coupled to a first bit line BL1. The cell strings CS1*m* and CS2*m* on an mth column are coupled to an mth bit line BLm.

Memory cells coupled to the same word line in the cell strings arranged in the row direction constitute one page. For example, memory cells coupled to the first word line WL1 in the cell strings CS11 to CS1*m* on the first row constitute one page. Memory cells coupled to the first word line WL1 in the cell strings CS21 to CS2*m* on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1*m* or CS21 to CS2*m* arranged in the row direction may be coupled to the even bit lines, respectively, and odd-numbered cell strings among the cell strings CS11 to CS1*m* or CS21 to CS2*m* arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn.

When a large number of dummy memory cells are provided, the reliability of an operation of the memory block BLKa is improved. On the other hand, the size of the memory block BLKa is increased. When a small number of dummy memory cells are provided, the size of the memory block BLKa is decreased. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 10:
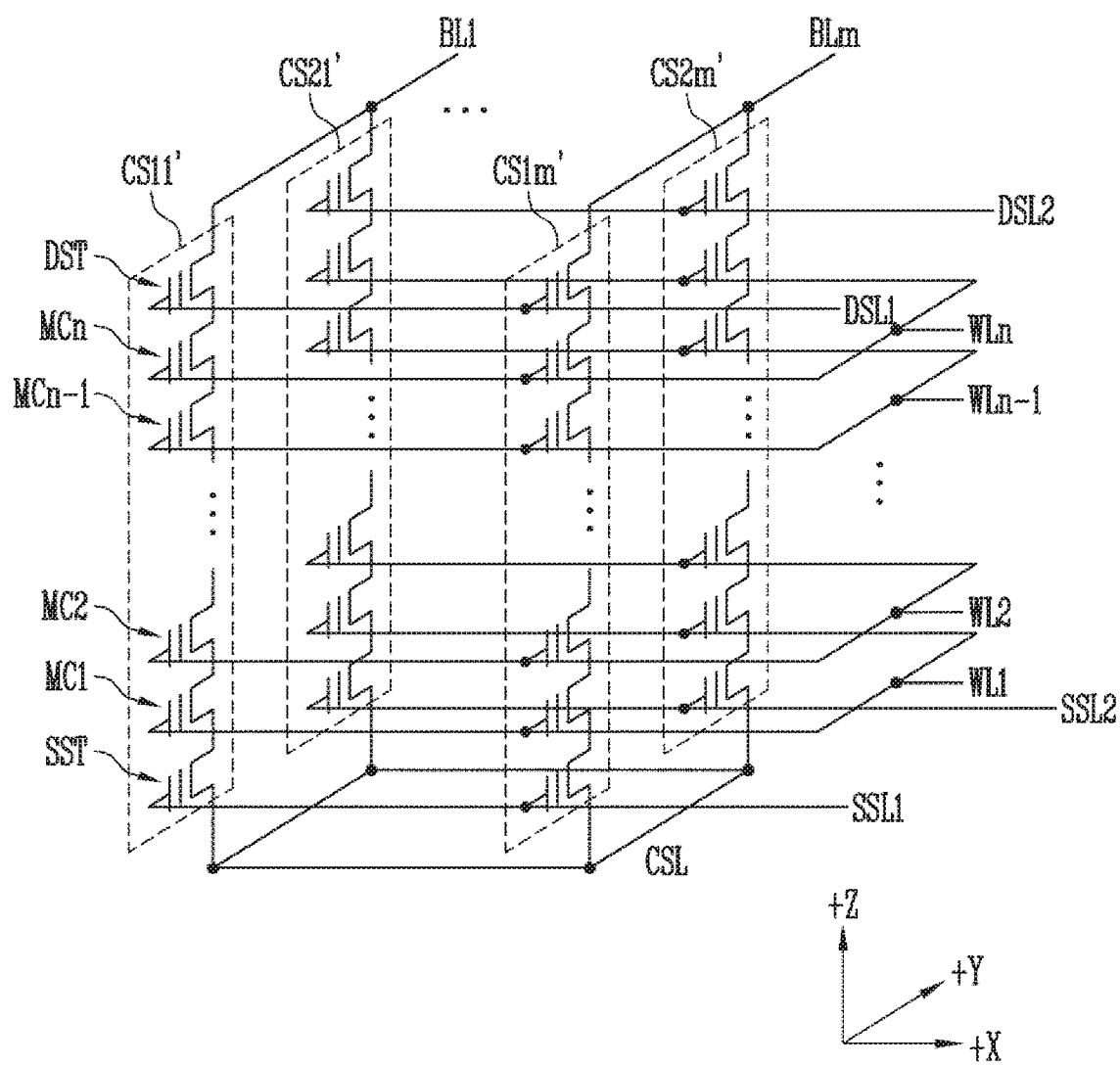
FIG. 10 is a circuit diagram illustrating another embodiment of the one memory block among the memory blocks of FIG. 8.

FIG. 10 is a circuit diagram illustrating another embodiment BLKb of the one memory block among the memory blocks BLK1 to BLKz of FIG. 8.

Referring to FIG. 10, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 10 has a circuit similar to that of the memory block BLKa of FIG. 9, except that the pipe transistor PT is excluded from each cell string in FIG. 10.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When a large number of dummy memory cells are provided, the reliability of an operation of the memory block BLKb is improved. On the other hand, the size of the memory block BLKb is increased. When a small number of dummy memory cells are provided, the size of the memory block BLKb is decreased. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 11:
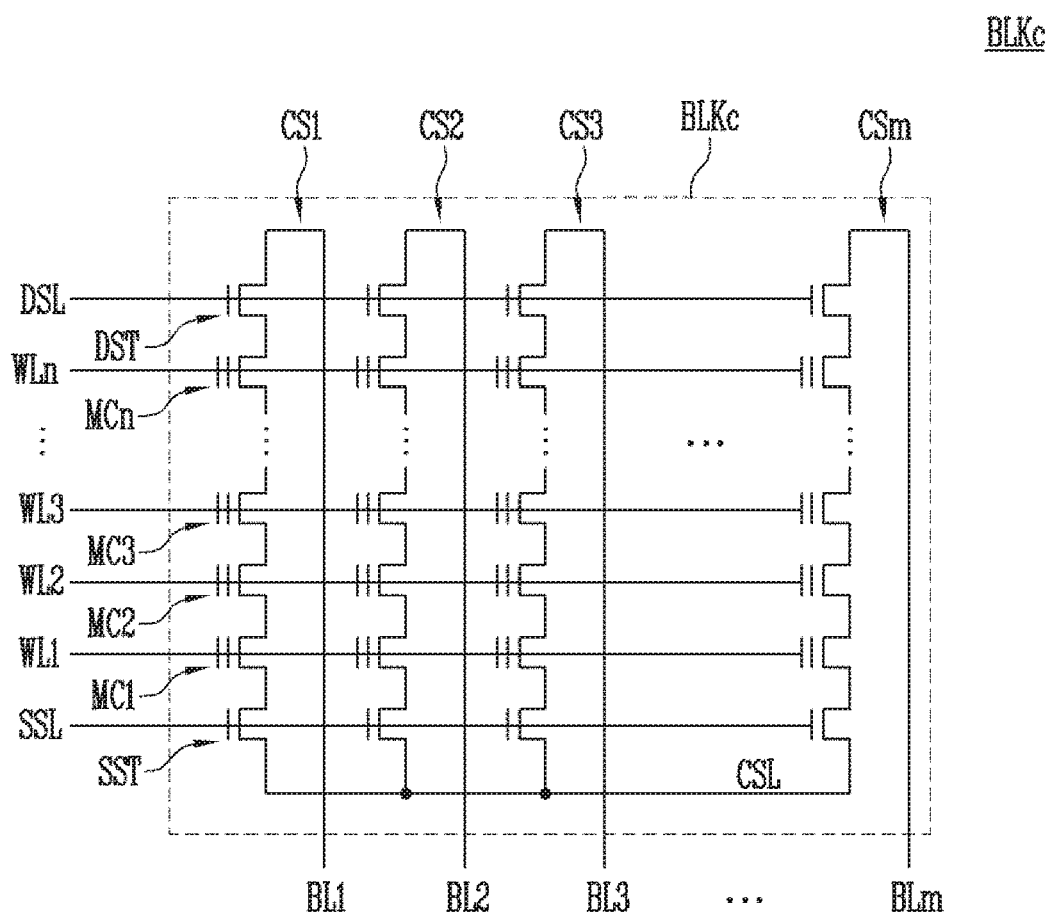
FIG. 11 is a circuit diagram illustrating another embodiment of the memory cell array of FIG. 7.

FIG. 11 is a circuit diagram illustrating another embodiment of the memory cell array 110 of FIG. 7.

Referring to FIG. 11, the memory cell array 110 may have a two-dimensional planar structure instead of the three-dimensional structure described with reference to FIGS. 8 to 10.

In FIG. 11, the memory block BLKc may include a plurality of strings CS1 to CSm. The plurality of strings CS1 to CSm may be coupled to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to nth memory cells MC1 to MCn of each cell string is coupled between the source select transistor SST and the drain select transistor DST.

The drain select transistor DST of each cell string is coupled between a corresponding bit line and the memory cells MC1 to MCn.

Memory cells coupled to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be coupled to the even bit lines, respectively, and odd-numbered cell strings among the cell strings CS1 to CSm may be coupled to the odd bit lines, respectively.

Figure 12:
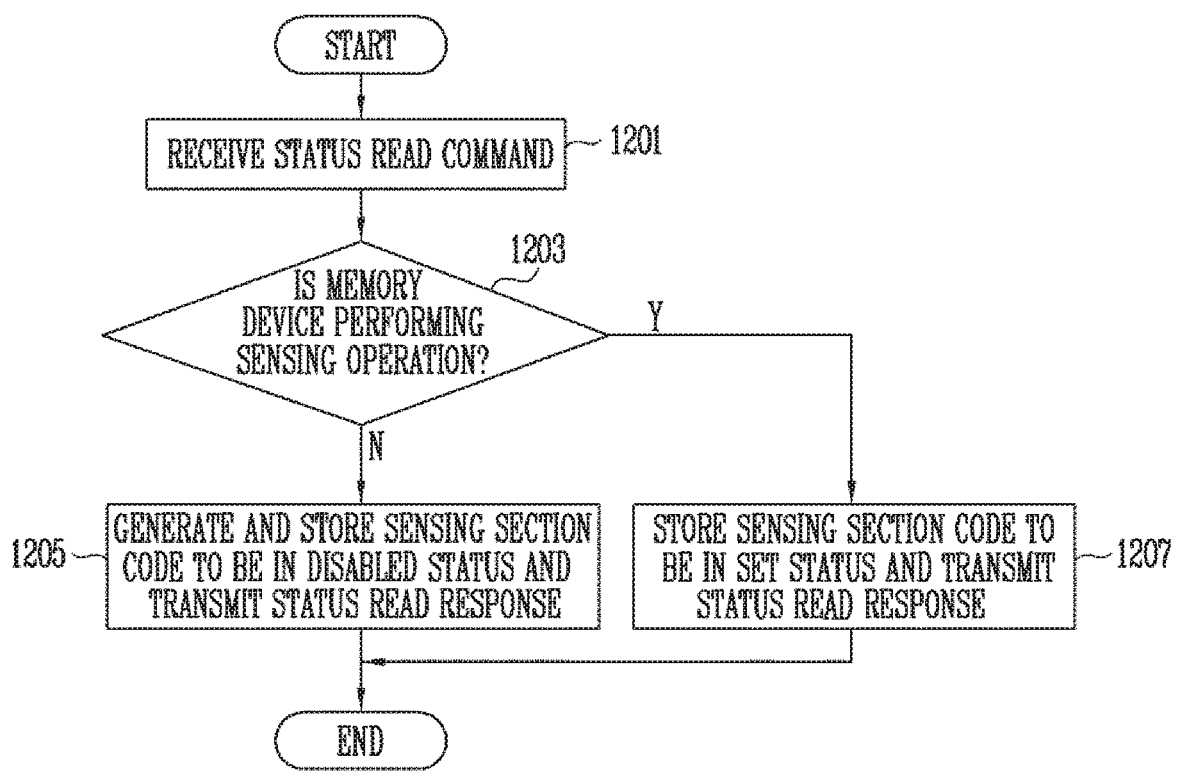
FIG. 12 is a flowchart illustrating an operation of the memory device according to an embodiment of the present disclosure.

FIG. 12 is a flowchart illustrating an operation of the memory device 100 according to an embodiment of the present disclosure.

Referring to FIG. 12, in step 1201, the memory device 100 may receive a status read command from the memory controller 200.

In step 1203, the memory controller 200 may determine whether the memory device 100 is performing a sensing operation. That the memory device 100 is performing the sensing operation may mean that the memory device 100 is performing a read operation. If the memory device 100 is performing the sensing operation (that is, 'Y' at step 1203), the memory controller 200 may proceed to step 1207. If the memory device 100 is not performing the sensing operation (that is, 'N' at step 1205), the memory controller 200 may proceed to step 1205.

In the step 1205, the memory device 100 may generate and store the sensing section code to be in disabled status in the status register, and transmit data stored in the status register as the status read response.

In the step 1207, the memory device 100 may generate and store the sensing section code of the set status in the status register, and transmit data stored in the status register as the status read response.

Figure 13:
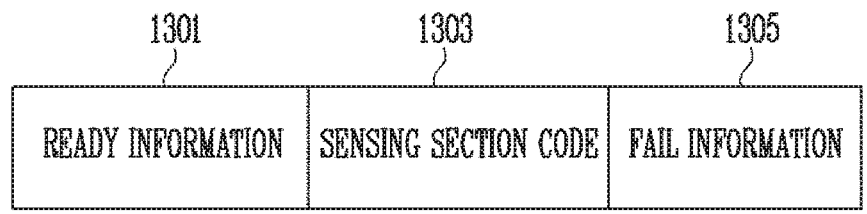
FIG. 13 is a diagram illustrating a status register of FIG. 7.

FIG. 13 is a diagram illustrating the status register 132 of FIG. 7.

The status register 132 may store data indicating an operation status of the memory device 100. The data stored in the status register 132 may be changed depending on an operation of the memory device 100.

Referring to FIG. 13, the data stored in the status register 132 may include ready information 1301, a sensing section code 1303, and fail information 1305.

The ready information 1301 may indicate that the memory device 100 is waiting to perform a new command. In an embodiment, the ready information 1301 may indicate that the reception of a new command is possible, and an operation performed by a previously received command has been completed. Thus, the controller 200 can recognize that a read operation on the Nth page in a cache read operation has been completed through the ready information 1301.

The sensing section code 1303 may indicate that the memory device 100 is performing a sensing operation. Specifically, the sensing section code 1303 may indicate that the memory device 100 belongs to a sensing section among a plurality of operation sections included in the read operation. If the sensing section code 1303 is in a set status, the sensing section code 1303 may indicate that the memory device 100 is performing the sensing operation. If the sensing section code 1303 is in a disabled status, the sensing section code 1303 may indicate that the memory device 100 is not performing the sensing operation. In an embodiment, the set status may be represented as '0,' and the disabled status may be represented as '1.' Alternatively, the set status may be represented as '1,' and the disabled status may be represented as '0.'

The fail information 1305 may indicate that an operation corresponding to the most recently performed command has failed. In an embodiment, the fail information 1305 may have an effective value with respect to only program and erase operations. In various embodiments, the fail information 1305 may indicate that an operation corresponding to the command received prior to the most recently performed command has failed.

Figure 14:
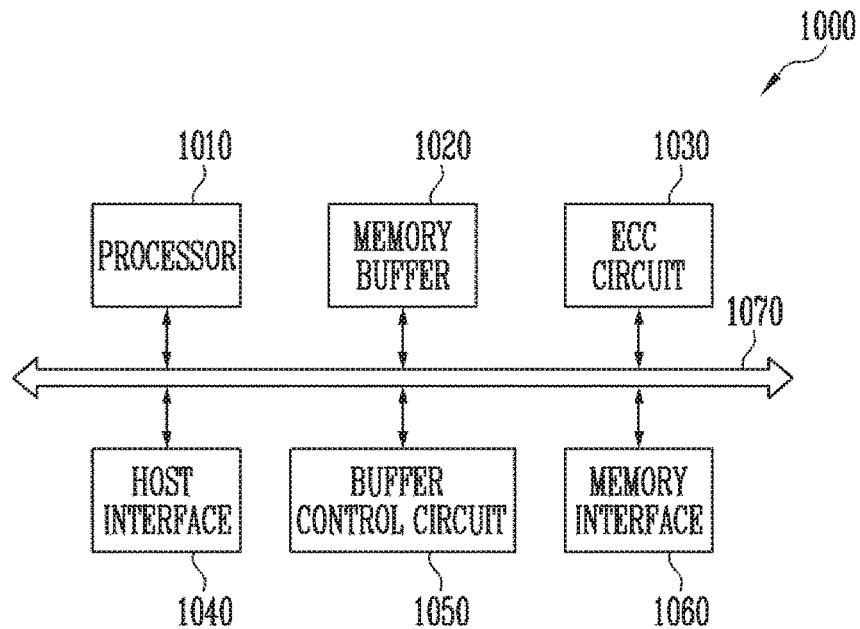
FIG. 14 is a diagram illustrating an embodiment of the memory controller of FIG. 1.

FIG. 14 is a diagram illustrating an embodiment of the memory controller 1000. For example, the memory controller 1000 may correspond to the memory controller 200 of FIG. 1.

Referring to FIG. 14, the memory controller 1000 is coupled to the host and the memory device. The memory controller 1000 may access the memory device in response to a request from the host. For example, the memory controller 1000 is configured to control read, write, erase, and background operations of the memory device. The memory controller 1000 may provide an interface between the memory device and the host. The memory controller 1000 may drive firmware for controlling the memory device.

Referring to FIG. 14, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device by using the memory buffer 1020 as a working memory, a cache memory, or a buffer memory.

The processor 1010 may perform a function of a flash translation layer (FTL). The processor 1010 may convert a logical block address (LBA) provided by the host into a PBA through the FTL. The FTL may receive an LBA using a mapping table, to convert the LBA into a PBA. There are various address mapping methods of the FTL according to mapping units. Representative address mapping methods include a page mapping method, a block mapping method, and a hybrid mapping method.

The processor 1010 may randomize data received from the host. For example, the processor 1010 may randomize the data received from the host by using a randomizing seed. The randomized data is provided as data to be stored to the memory device, to be programmed in a memory cell array.

The processor 1010 may derandomize data received from the memory device in a read operation is performed. For example, the processor 1010 may derandomize the data received from the memory device by using a derandomizing seed. The derandomized data may be output to the host.

In an embodiment, the processor 1010 may perform randomizing and derandomizing by driving software or firmware.

In an embodiment, the processor 1010 may perform an operation of the cache read controller 210 described with reference to FIGS. 1 and 5.

The memory buffer 1020 may be used as the working memory, the cache memory, or the buffer memory of the processor 1010. The memory buffer 1020 may store codes and commands, which are executed by the processor 1010. The memory buffer 1020 may include a static RAM (SRAM) or a dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. As an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer control circuit 1050 may control the memory buffer 1020 under the control of the processor 1010.

The memory interface 1060 may communicate with the memory device under the control of the processor 1010. The memory device 1060 may communicate a command, an address, and data with the memory device through a channel.

As an example, the memory controller 1000 may not include the memory buffer 1020 and the buffer control circuit 1050.

As an example, the processor 1010 may control an operation of the memory controller 1000, using codes. The processor 1010 may load codes from a nonvolatile memory device (e.g., a read only memory (ROM)) provided inside the memory controller 1000. As another example, the processor 1010 may load codes from the memory device through the memory interface 1060.

As an example, the bus 1070 of the memory controller 1000 may be divided into a control bus and a data bus. The data bus may transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 15:
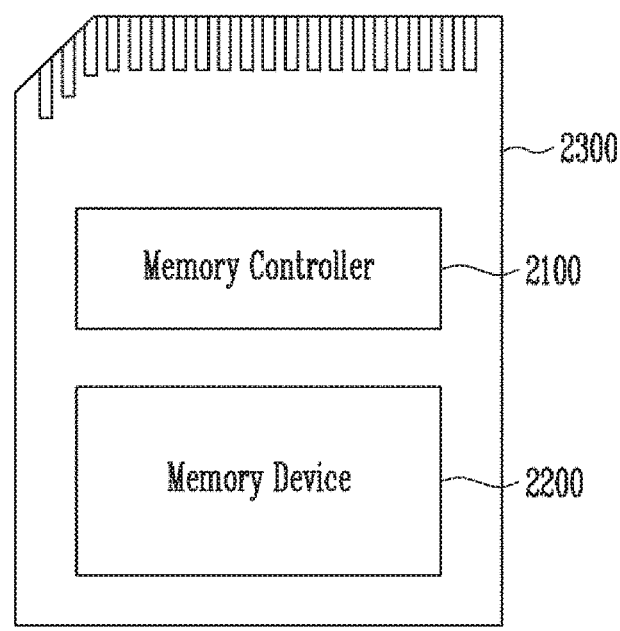
FIG. 15 is a block diagram illustrating a memory card system to which the storage device is applied according to an embodiment of the present disclosure.

FIG. 15 is a block diagram illustrating a memory card system to which the storage device is applied according to an embodiment of the present disclosure.

Referring to FIG. 15, the memory card system 2000 includes a memory controller 2100, a memory device 2200, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

As an example, the memory controller 2100 may include components such as a random access memory (RAM), a processing unit, a host interface, a memory interface, and an ECC circuit.

The memory controller 2100 may communicate with an external device through the connector 2300. The memory controller 2100 may communicate with an external device (e.g., a host), based on a specific communication protocol. As an example, the memory controller 2100 may be configured to communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UFS), Wi-Fi, Bluetooth, and NVMe. As an example, the connector 2300 may be defined by at least one of the above-described communication protocols.

As an example, the memory device 2200 may be implemented with various nonvolatile memory devices, such as an electrically erasable and programmable ROM (EPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The operation of the cache read controller 210 described with reference to FIGS. 1 and 5 may be performed by the memory controller 2100.

As an example, the memory controller 2100 or the memory device 2200 may be provided as one semiconductor package by being packaged using any of a variety of different packaging technologies, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP). Alternatively, the memory device 2200 may include a plurality of nonvolatile memory chips, and the plurality of nonvolatile memory chips may be provided as one semiconductor package by being packaged using one of the above-described packaging technologies.

As an example, the memory controller 2100 and the memory device 2200 may be integrated in a single semiconductor device. As an example, the memory controller 2100 and the memory device 2200 may be integrated in a single semiconductor device to constitute a solid state drive (SSD). The memory controller 2100 and the memory device 2200 may be integrated in a single semiconductor device to constitute a memory card. For example, the memory controller 2100 and the memory device 2200 may be integrated in a single semiconductor device to constitute a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), or a universal flash storage (UFS).

As an example, the memory device 2200 may be the memory device 100 described with reference to FIGS. 1 and 7.

Figure 16:
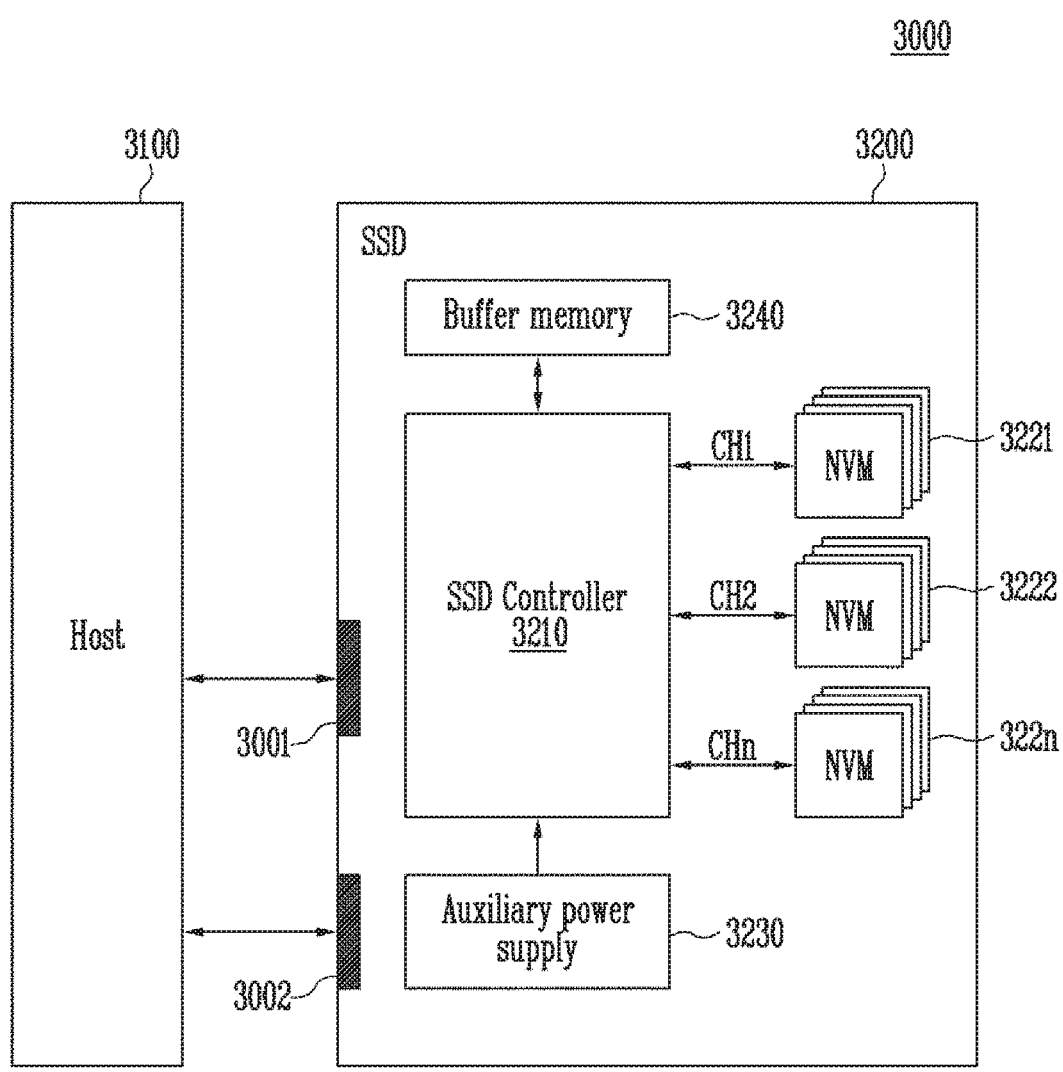
FIG. 16 is a block diagram illustrating a solid state drive (SSD) system to which the storage device is applied according to an embodiment of the present disclosure.

FIG. 16 is a block diagram illustrating a solid state drive (SSD) system to which the storage device is applied according to an embodiment of the present disclosure.

Referring to FIG. 16, the SSD system 3000 may include a host 3100 and an SSD 3200. The SSD 3200 may exchange signals SIG with the host 3100 through a signal connector 3001, and receive power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. As an example, the signal SIG may be a signal based on an interface between the host 3100 and the SSD 3200. For example, the signal SIG may be a signal defined by at least one of interfaces such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UFS), Wi-Fi, Bluetooth, and NVMe.

The auxiliary power supply 3230 is coupled to the host 3100 through the power connector 3002. The auxiliary power supply 3230 may receive power PWR from the host 3100 and be charged by the power PWR. When the supply of power from the host 3100 is not smooth, the auxiliary power supply may provide power of the SSD 3200. As an example, the auxiliary power supply 3230 may be located in the SSD 3200 or be located at the outside of the SSD 3200. For example, the auxiliary power supply 3230 may be located on a main board and provide auxiliary power to the SSD.

The buffer memory 3240 may operate as a buffer memory of the SSD 3200. For example, the buffer memory 3240 may temporarily store data received from the host 3100 or the plurality of flash memories 3221 to 322n, or temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

As an example, the nonvolatile memories 3221 to 322n may be the memory device 100 described with reference to FIGS. 1 and 7.

FIG. 17 is a block diagram illustrating a user system to which the storage device is applied according to an embodiment of the present disclosure.

Referring to FIG. 17, the user system 4000 includes an application processor 3100, a memory module 4200, a network module 4300, a storage module 4400, and a user interface 4500.

The application processor 4100 may drive components included in the user system 4000, an operating system (OS), a user program, or the like. As an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory, or cache memory of the user system 4000. The memory module 4200 may include volatile random access memories such as DRAM, SDRAM, DDR SDRAM, DDR2 SDRAM, DDR3 SDRAM, LPDDR SDRAM, LPDDR2 SDRAM, and LPDDR3 SDRAM or nonvolatile random access memories such as PRAM, ReRAM, MRAM, and FRAM. As an example, the application processor 4100 and the memory module 4200 may be provided in a single semiconductor package by being packaged based on Package on Package (PoP).

The network module 4300 may communicate with external devices. As an example, the network module 4300 may support wireless communication protocols such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, Bluetooth, and Wi-Fi. As an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. As an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. As an example, the storage module 4400 may be provided as a removable drive such as a memory card of the user system 4000 or an external drive.

As an example, the storage module 4400 may include a plurality of nonvolatile memory devices, and the plurality of nonvolatile memory devices may be the memory device 100 described with reference to FIGS. 1 and 7.

The user interface 4500 may include interfaces for inputting data or a command to the application processor 4100 or outputting data to an external device. As an example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may include user output interfaces such as a liquid crystal display (LCD), an organic light emitting diode (OLED) display, an active matrix OLED (AMOLED) display, an LED, a speaker, and a monitor.

According to the present disclosure, it is possible to provide a memory controller for controlling a memory device to perform a more stable sensing operation, a storage device including the memory controller, and an operating method of the storage device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller comprising:
a processor configured to transmit a cache read command to a memory device and then transmit a status read command to the memory device; and
a cache read controller configured to output a data-out command to the memory device according to a sensing section code included in a status read response transmitted by the memory device in response to the status read command,
wherein the cache read command is a read command for arbitrary Nth and (N+1)th pages included in the memory device, and
wherein the processor determines whether a read operation on the Nth page has been completed from the status read response.

2. The memory controller of claim 1, wherein the sensing section code is data indicating that the memory device belongs to a sensing section among a plurality of operation sections included in a read operation.

3. The memory controller of claim 1, wherein the cache read controller includes:
a status read controller configured to output an enable signal, if the sensing section code is in a disabled status; and
a data-out command controller configured to transmit the data-out command to the memory device in response to the enable signal.

4. The memory controller of claim 3, wherein the status read controller transmits, if the sensing section code is in a set status, the status read command to the memory device.

5. The memory controller of claim 3, wherein the status read controller transmits, if a predetermined time elapses from a point of time when the cache read command is transmitted, the status read command to the memory device.

6. The memory controller of claim 1, wherein the processor transmits, when the read operation on the Nth page is not completed, the status read command to the memory device.

7. The memory controller of claim 1, wherein the status read response is data stored in a status register for storing an operation status of the memory device.

8. A method for operating a memory controller for controlling a memory device, the method comprising:
transmitting, to the memory device, a cache read command for at least two pages included in the memory device;
transmitting, to the memory device, a status read command for requesting data of a status register storing an operation status of the memory device;
determining whether a read operation on a precedent page among the at least two pages has been completed based on the status read response transmitted by the memory device in response to the status read command; and
transmitting a data-out command to the memory device according to a sensing section code included in a status read response transmitted by the memory device in response to the status read command.

9. The method of claim 8, wherein the transmitting of the data-out command includes:
determining whether the sensing section code included in the status read response is in a disabled status; and
transmitting, if the sensing section code is in the disabled status, the data-out command to the memory device.

10. The method of claim 9, further comprising re-transmitting, if the sensing section code included in the status read response is in a set status, the status read command to the memory device.

11. The method of claim 8, further comprising re-transmitting, when the read operation on the precedent page among the at least two pages is not completed, the status read command to the memory device.

12. The method of claim 8, wherein the sensing section code is data indicating that the memory device belongs to a sensing section among a plurality of operation sections included in a read operation.

13. A storage device comprising:
a memory device configured to perform an operation corresponding to a cache read command for at least two pages; and
a memory controller configured to transmit a data-out command to the memory device, based on a sensing section code included in a status read response transmitted by the memory device in response to a status read command transmitted to the memory device,
wherein the memory device includes a status register for storing data on an operation status of the memory device, and
wherein the data of the status register includes ready information indicating that a read operation of a precedent page among the at least two pages has been completed and the sensing section code.

14. The storage device of claim 13, wherein the status read response includes data of the status register.

15. The storage device of claim 13, wherein the sensing section code is data indicating that the memory device belongs to a sensing section for storing data of a memory cell in a page buffer among a plurality of operation sections included in a read operation.

16. The storage device of claim 15, wherein the memory controller transmits, if the sensing section code is in a disabled status, the data-out command to the memory device.

* * * * *